US008468969B2

(12) United States Patent
Beaudoin et al.

(10) Patent No.: US 8,468,969 B2
(45) Date of Patent: Jun. 25, 2013

(54) DIMENSIONALLY STABLE DURABLE THERMAL SPRAY MASKING SYSTEM

(75) Inventors: Charles R Beaudoin, Lyman, ME (US); Donn R Blankenship, Southbury, CT (US); Christopher W Strock, Kennebunk, ME (US)

(73) Assignee: United Technologies Corporation, Hartford, CT (US)

( * ) Notice: Subject to any disclaimer, the term of this patent is extended or adjusted under 35 U.S.C. 154(b) by 125 days.

(21) Appl. No.: 12/956,288

(22) Filed: Nov. 30, 2010

(65) Prior Publication Data

US 2012/0132138 A1 May 31, 2012

(51) Int. Cl.
*B05C 13/00* (2006.01)
*B05C 13/02* (2006.01)
*B05C 21/00* (2006.01)
*B05C 11/11* (2006.01)
*C23C 16/00* (2006.01)

(52) U.S. Cl.
USPC ........... 118/504; 118/503; 118/505; 118/721; 118/715; 118/720

(58) Field of Classification Search
USPC .................. 118/500–505, 724, 715, 720, 301
See application file for complete search history.

(56) References Cited

U.S. PATENT DOCUMENTS

| | | | | |
|---|---|---|---|---|
| 3,818,982 | A * | 6/1974 | Wagner | 118/503 |
| 6,037,004 | A * | 3/2000 | Zajchowski et al. | 118/504 |
| 6,109,873 | A | 8/2000 | Brooks et al. | |
| 7,413,610 | B2 * | 8/2008 | Mielke | 118/724 |
| 2006/0021579 | A1 | 2/2006 | Bernaski et al. | |
| 2007/0141261 | A1 | 6/2007 | Tefft | |
| 2009/0252872 | A1 | 10/2009 | Saylor et al. | |

FOREIGN PATENT DOCUMENTS

| | | | |
|---|---|---|---|
| EP | 0965389 | A1 | 12/1999 |
| EP | 1630256 | A1 | 3/2006 |
| EP | 1801360 | A2 | 6/2007 |

* cited by examiner

*Primary Examiner* — Dah-Wei Yuan
*Assistant Examiner* — Binu Thomas
(74) *Attorney, Agent, or Firm* — Bachman & LaPointe, P.C.

(57) ABSTRACT

A masking system protects portions of a part, such as a turbine engine component, to be coated. The masking system has a base, a conduit positioned on said base, a part to be coated being positioned over the conduit, and an annular plate positioned over the conduit and resting on a first portion of the part.

12 Claims, 1 Drawing Sheet

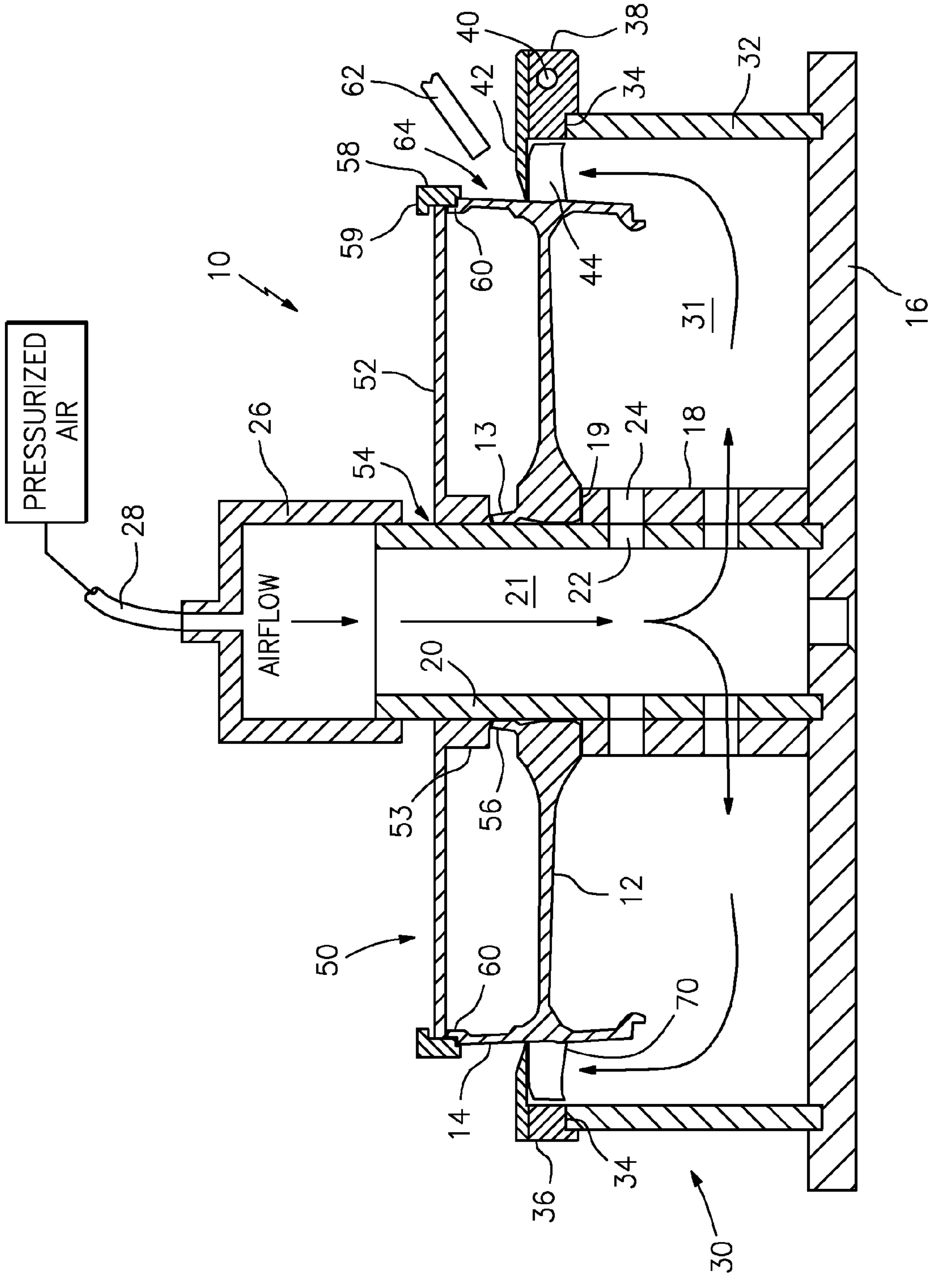
PRESSURIZED AIR
AIRFLOW
10
12
13
14
16
18
19
20
21
22
24
26
28
30
31
32
34
36
38
40
42
44
50
52
53
54
56
58
59
60
62
64
70

DIMENSIONALLY STABLE DURABLE THERMAL SPRAY MASKING SYSTEM

BACKGROUND

The present disclosure relates to a dimensionally stable durable thermal spray masking system for protecting a portion of a part such as a turbine engine component.

Certain rotors and rotor spacers that receive ceramic thermal spray coatings have very tight spacing of the coating pocket to no-coat areas such as blades and surfaces that mate to adjacent parts. These no-coat areas are typically masked in order to protect them from plasma spray deposition. Conventional tape and polymer based maskants tend to burn off due to the high heat input from the spray process that is associated with achieving a microcracked structure of the coating. Durable metal based masking has been made from Inconel sheet stock and machined from thick sections. Due to the high heat input of the process, these masks may distort and may not maintain the tight tolerances necessary along the edges of the coat to no-coat regions.

SUMMARY

In accordance with the instant disclosure, there is provided a masking system for protecting portions of a part to be coated, which masking system broadly comprises a base, a conduit mounted on said base, said part to be coated being positioned over said conduit, and an annular plate positioned over said conduit and resting on a first portion of said part.

Also in accordance with the instant disclosure, there is provided a masking system for protecting portions of a turbine engine component being coated comprising a central conduit positioned on a base, an annular tube positioned on said base, a turbine engine component having a plurality of airfoils positioned over said central conduit, and means for reducing overspraying adhering to said airfoils.

Other details of the masking system of the present invention are set forth in the following detailed description and the accompanying drawing wherein like reference numerals depict like elements.

BRIEF DESCRIPTION OF THE DRAWINGS

The FIGURE is a cross sectional view of a masking system.

DETAILED DESCRIPTION OF THE PREFERRED EMBODIMENT(S)

As set forth herein, there is provided a system for masking a portion of a part, such as a turbine engine component, to be coated. The system described herein has durable metallic masking features that are free to expand and contract without distortion. These features are known as floating rings. These rings are relatively small and mostly, if not completely, coated with the part. The rings are not intended to provide full protection to the part; however, the rings do create the close tolerance edge feature which is needed. The rings work to hold tight tolerances because the rings come up to temperature during spray with the part while not being constrained by additional mask features that are not equally heated. The rings are easily replaceable since they are not fixed to their support structures.

Further, the system described herein provides masking which is pressurized with air to create a leakage flow along the gap between the masking and the coating area. This is to help counter the flow of overspray material that deflects under the mask and prevent it from adhering to portions of the part being coated, such as the airfoils of an integrally bladed rotor (IBR). The air is supplied to the rotating part during spray through a rotary fitting located at a top portion of the masking system.

Referring now to the FIGURE, there is shown a masking system 10 for coating one or more portions 14 of a part or turbine engine component 12 such as an IBR. As can be seen from the FIGURE, the masking system 10 includes a rotatable metallic base 16 to which is mounted a central support column 18. The rotatable base 16 may be secured to any suitable means (not shown) for rotating same. Fitted within the central support column 18 is a fluid conduit 20. The fluid conduit 20 is positioned on the base 16. It may be mounted to the base if desired using any suitable fastening device known in the art. The component 12 to be coated has a hub 13 which allows the component to be placed over the exterior of the fluid conduit 20 and seated on an end 19 of the central support column 18.

As can be seen from the Figure, the fluid conduit 20 has one or more holes 22 which align with one or more holes 24 in the central support column 18. The fluid conduit 20 mates with an air cap 26 which rotates with the base 16. Not shown is a rotary union between air cap 26 and an air hose 28 which is connected to a source of pressurized air.

The masking system 10 uses two separate masks 30 and 50 to protect those portions of the component 12 to which a coating is not to be applied. The lower mask 30 comprises an annular metallic tube 32 which is positioned on the base 16. The tube 32, if desired, may be connected to the base 16 using any suitable fastening device known in the art. The annular tube 32 has an edge 34 on which an annular masking element 36 in the form of a flexible ring is positioned. If desired, the annular masking element 36 may be a single annular ring or may be a ring formed from a plurality of sections 38 joined together by one or more bolts 40 which allow the circumference of the masking element 36 to be adjusted so that the masking element 36 fits around the annular tube 32 and the component 12. Since the masking element 36 is not fixed to the tube 32, it is free to expand and contract without distortion. The masking element 36, as shown in the Figure, has an annular lip 42 which overlaps, but does not contact, a desired portion of the component 12, such as the airfoils 44 on the component 12. The annular lip 42 may be integrally formed with the sections 38 or may be placed over the sections 38 so as to rest on the sections 38. Alternatively, if desired, the annular lip 42 may be joined to the sections 38 using any suitable fastening means known in the art.

The masking system 10 further comprises an upper mask 50 which includes an annular metallic plate 52 which has a central opening 54 which allows the plate 52 to be positioned over the fluid conduit 20. The plate 52 rests on a first portion 56 of the component 12 at an inner end and a second portion 60 of the component 12 at an outer end. As can be seen from the FIGURE, the plate 52 has a downwardly depending portion 53 which contacts the portion 56. The upper mask 50 further comprises an outer masking element or flexible ring 58 which rests on another portion 60 of the component 12. The outer masking element 58 has a first portion 59 which overlaps the portion 60 and which overlaps the plate 52. The outer masking element 58 is positioned adjacent the plate 52 using a slip fit. Since it is not connected to the plate 52, the outer masking element 58 is free to expand and/or contract without distortion.

As shown in the FIGURE, one or more spray nozzles 62 are provided to coat the portion 14 of the component 12. The spray nozzles 62 aim the coating material towards the gap 64 between the lower and upper masks 30 and 50 respectively.

Air is utilized to reduce overspraying of the coating material from adhering to the airfoils 44. Pressurized air may be supplied to the conduit 20 via the air hose 28 and the air cap 26. Pressurized air flows through the interior 21 of the conduit 20 and then into the interior 31 of the annular tube 32 via the holes 22 and 24. The pressurized air then rises up under the pressure at the base 70 of the airfoils 44 and exits the tube 32 in the vicinity of the base 70. In this way, the amount of any overspray adhering to the airfoils 44 is reduced.

While the various components of the masking system have been described as being metallic, they may also be made from any suitable material known in the art if desired. As noted above, the components of the masking system may all be formed from a metallic material such as cold rolled steel.

The masking system described hereinbefore is beneficial in that it includes a tight tolerance part design which is easy to manufacture. Further, it provides cost savings by limiting the amount of manual part cleanup that is necessary after coating.

There has been described in accordance with the present disclosure a dimensionally stable durable thermal spray masking system. While the dimensionally stable durable thermal spray masking system has been described in the context of a specific embodiment thereof, other unforeseeable alternatives, modifications, and variations may become apparent to those skilled in the art having read the foregoing description. Accordingly, it is intended to embrace those alternatives, modifications, and variations, as fall within the broad scope of the appended claims.

What is claimed is:

1. A masking system for protecting portions of a turbine engine component being coated comprising:

a central conduit positioned on a base;

a central support column positioned on said base, said central support column abutting said central conduit;

a turbine engine component having a plurality of airfoils positioned over said central conduit and in contact with said central support column;

means for reducing overspraying adhering to said airfoils; and a top mask for protecting a first portion of said turbine engine component from being coated and a lower mask mounted on an annular tube for protecting said airfoils from being coated.

2. The masking system of claim 1, wherein said means for reducing overspraying comprises means for creating a flow of pressurized air in said annular tube which exits at a base of said airfoils.

3. The masking system of claim 2, wherein said means for creating a flow of pressurized air comprises a source of pressurized air connected to said central conduit and holes in said central conduit for introducing said pressurized air into said annular tube.

4. The masking system of claim 1, wherein said top mask comprises an annular plate positioned over said central conduit and resting on a first portion of said part.

5. The masking system according to claim 4, further comprising an outer masking element positioned at an end of said annular plate.

6. The masking system according to claim 5, further comprising said outer masking element resting on a second portion of said part.

7. The masking system according to claim 1, wherein said lower mask comprises:

said annular tube being positioned on said base; and an annular masking element positioned on an upper end of said annular tube.

8. The masking system according to claim 7, further comprising said annular masking element overlapping said plurality of airfoils.

9. The masking system of claim 2, wherein said means for creating a flow of pressurized air comprises:

said central conduit having a plurality of holes; and said central support column having a plurality of holes aligned with the holes in said central conduit.

10. The masking system of claim 9, wherein said means for creating a flow of pressurized air further comprises a source of air connected to an interior of said central conduit via a fitting.

11. The masking system of claim 1, further comprising said central support column supporting an interior portion of said turbine engine component.

12. The masking system of claim 1, wherein said base is a rotatable base.

* * * * *